United States Patent [19]

d'Auria et al.

[11] 4,217,598
[45] Aug. 12, 1980

[54] ELECTROLUMINESCENT PHOTODETECTOR DIODE AND BUSBAR LINES USING SAID DIODE

[75] Inventors: Luigi d'Auria; Baudoin de Crenoux; André Jacques, all of Paris, France

[73] Assignee: Thomson-CSF, Paris, France

[21] Appl. No.: 895,502

[22] Filed: Apr. 11, 1978

[30] Foreign Application Priority Data

Apr. 15, 1977 [FR] France .................. 77 11425

[51] Int. Cl.² .................. H01U 31/12; H01L 29/161
[52] U.S. Cl. .................. 357/19; 357/16; 357/17; 357/61; 250/227; 350/96.12; 350/96.16
[58] Field of Search .................. 357/30, 16, 17, 18, 357/19, 61, 58; 250/227; 350/96.12, 96.16; 331/94.5 H

[56] References Cited

U.S. PATENT DOCUMENTS

| | | | |
|---|---|---|---|
| 3,936,855 | 2/1976 | Goell | 357/17 |
| 3,952,265 | 4/1976 | Hunsperger | 331/94.5 H |
| 3,982,207 | 9/1976 | Dingle | 331/94.5 H |
| 3,982,261 | 9/1976 | Antypas | 357/16 |
| 4,021,834 | 5/1977 | Epstein | 357/19 |
| 4,053,914 | 10/1977 | Goodwin | 357/17 |
| 4,071,753 | 1/1978 | Fulenwider | 250/227 |
| 4,100,422 | 2/1978 | Thillays | 250/551 |
| 4,103,154 | 7/1978 | d'Auria | 250/227 |
| 4,152,713 | 5/1979 | Copeland | 357/19 |

*Primary Examiner*—Martin H. Edlow
*Attorney, Agent, or Firm*—Cushman, Darby & Cushman

[57] ABSTRACT

An electroluminescent and photodetector diode comprises two electrodes made of materials which are transparent to a radiation of given frequency band, and, arranged between these two electrodes, a very thin layer of a material absorbing said radiation. This diode can be used in a busbar line.

8 Claims, 5 Drawing Figures

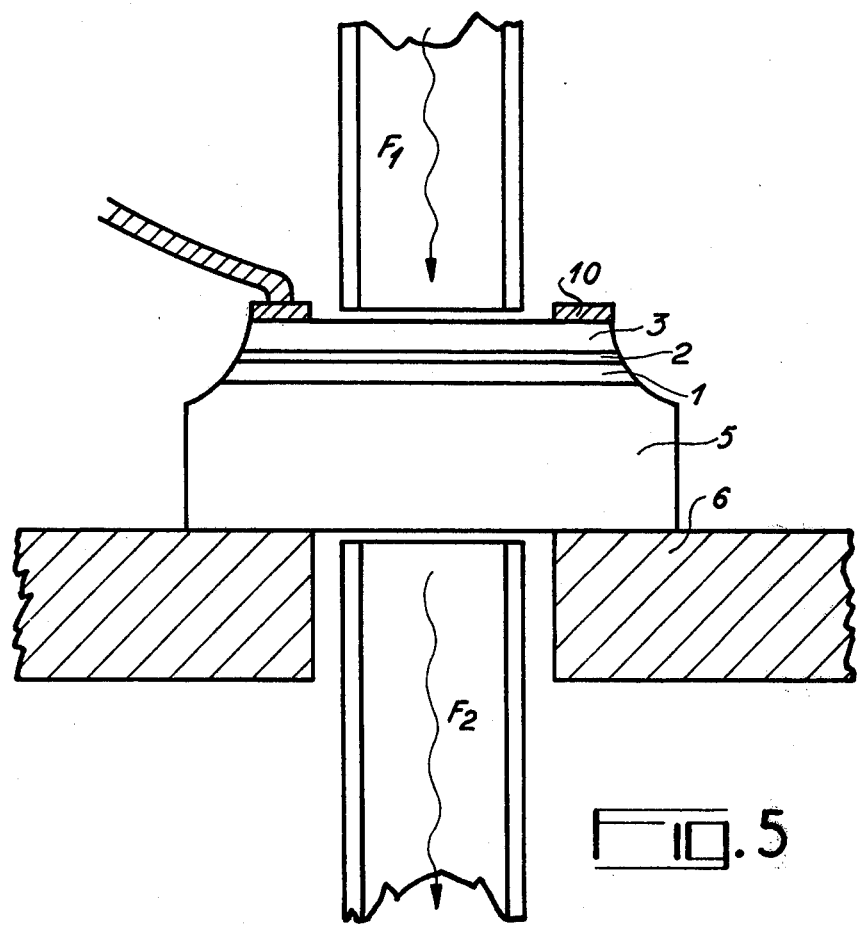

ELECTROLUMINESCENT PHOTODETECTOR DIODE AND BUSBAR LINES USING SAID DIODE

Those skilled in the art will be aware that in telecommunications systems busbars are used, that is to say lines which enable several subscribers connected through a single line, to establish calls between each other. Each station comprises a transceiver unit and means which make it possible to change from the regime of transmission to other subscribers to that of reception of signals coming from other subscribers.

The present invention makes it possible to transfer this technique to the situation in which telecommunications via optical fibres are being established, this thanks to the use of a novel diode which is both an light emissive diode and photodetector diode, inserted into a set of optical fibres linking the various subscribers, this diode being transparent vis-a-vis radiations transmitted by the system of optical fibres.

The light emissive diode in accordance with the invention comprises an active layer of a first semiconductor material of small thickness whose forbidden band is such that it is capable of absorbing a radiation of a given wavelength, this layer being sandwiched between two layers of material transparent vis-a-vis said wavelength, these two layers forming with said active layer a double hetero-junction, the whole arrangement being transparent to said wavelength, this by reason of the small thickness of the active layer.

A diode of this kind can thus be inserted into an optical line of the busbar kind without introducing any losses there, and, depending upon the way in which it is biased, can be operated as a light emissive diode capable of emitting said radiation and equally as a photodiode capable of detecting signals transmitted by the optical fibre.

The invention will be better understood from a consideration of the ensuing description and by reference to the attached drawings in which.

Figure 4:
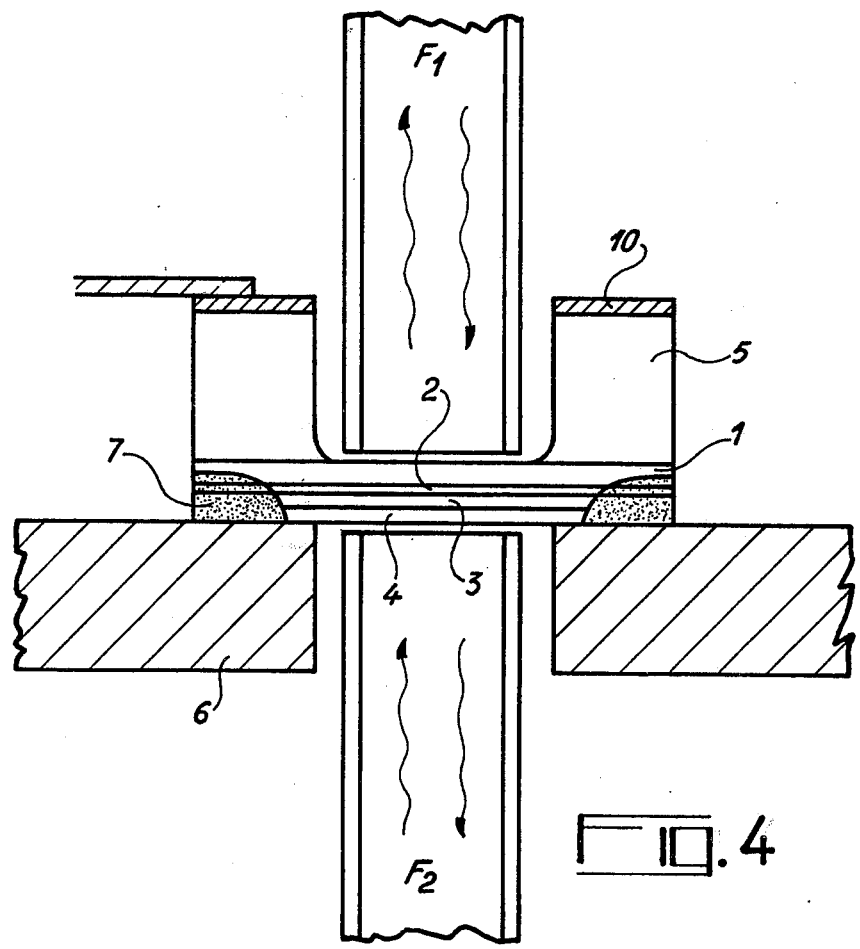

FIGS. 4 and 5 respectively illustrate two embodiments of diodes in accordance with the invention.

Figure 1:
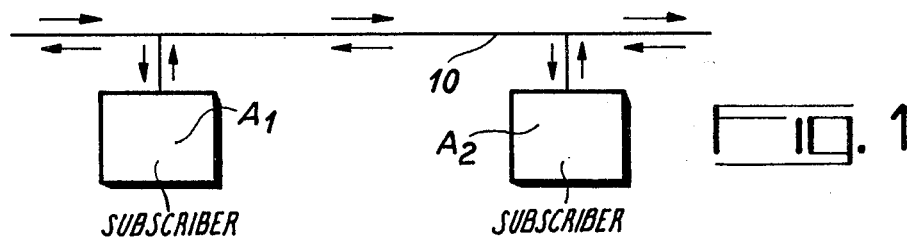
FIG. 1 illustrates a busbar line.
Figure 2:
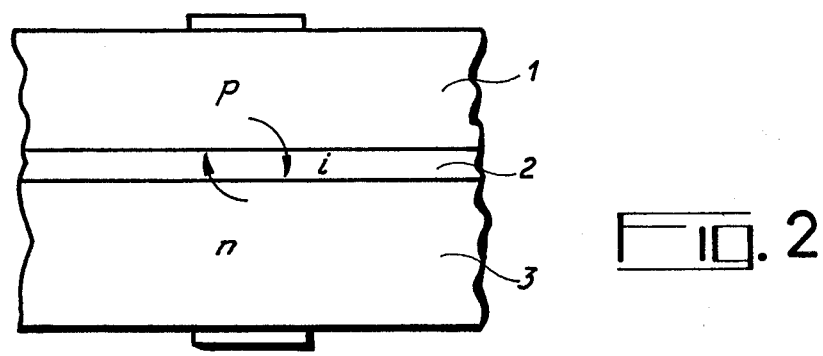
FIG. 2 illustrates an enlarged sectional view of the diode in accordance with the invention.

FIG. 1 illustrates a telecommunication system of the kind known as a busbar line. This system comprises a line 10 which can for example transmit a radiation, this in two directions of propagation $F_1$ and $F_2$. Coupled to this line are subscribers stations $A_1$, $A_2$... Each of these stations has a coded address digit assigned to it and receives and retransmits pulse code modulated radiation through the line: the assembly of signals carries both the information and the address of one of the different subscribers.

The advantage of this kind of system is its simplicity. However, it goes without saying that there is a fundamental drawback to be overcome. As soon as a subscriber station breaks down, the whole system ceases to operate.

The diode in accordance with the invention makes it possible to avoid this drawback.

It comprises in a superimposed arrangement, three layers 1, 2 and 3, the layer 2 designed hereinafter as the active layer, being very thin and having a thickness of the order of 0.3 to 1 μm. It is made of a material absorbing the light radiation under which it is intended to operate, but in which the transmission losses are around 1.3 dB per micron of thickness. For a thickness of 0.3 μm, these losses will be of about 0.3 dB.

This layer is sandwiched between the two layers 1 and 3 which are layers of respectively opposite conductivity types, namely p-type material in the case of the layer 1 and n-type material in the case of the layer 3. These layers have a much greater thickness, in the order of 1 to 10 μm, and form respectively two hetero-junctions with the layer 1. These materials have a forbidden band which is wider than that of the zone 2 and they are transparent to the radiation. The result is that when the diode is forward-biased, and its two terminal faces are respectively in contact with two optical fibre sections, $F_1$ and $F_2$, thus the electrons coming from the zone 3 will combine with the holes coming from the zone 2 into the zone 1.

The resultant photon-generation mechanism will enable radiation to be emitted and this will pass through the zones 1 and 3 since they are transparent.

In the same way, if the diode is reverse-biased, and if one of its faces is exposed to the radiation, the photons reaching the zone 1 will give rise to electron-hole pairs and the electric current resulting from this will give rise to an electrical signal.

Figure 3:
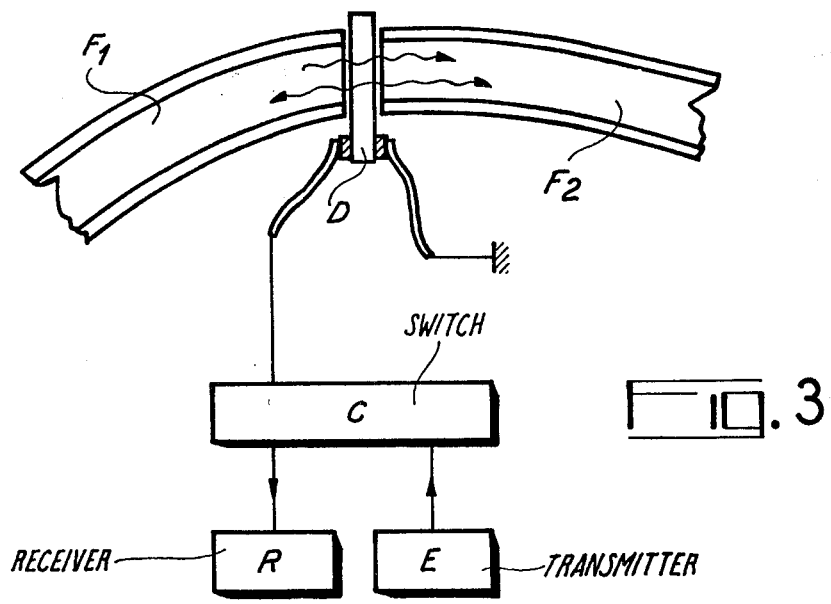
FIG. 3 illustrates a busbar line comprising diodes in accordance with the invention.

FIG. 3 illustrates a busbar line made up of optical fibres, and a subscriber station. Each subscriber station comprises a diode D in accordance with the invention arranged between two fibre sections $F_1$ and $F_2$.

The two terminals of the diode are connected respectively to earth and to a contactor C having two outputs respectively connected to the transmission system E and to the reception system R. During a reception sequence, the diode is reverse-biased and during a transmission sequence it is forward-biased. In any case, it is transparent to the radiations transmitted by the various optical fibre sections. The result is that even in the case of a failure at the subscriber station, it presents no obstacle to transmission of the light energy.

The diode shown in FIG. 4 by way of a first, non-limitative, example of the invention, comprises a substrate 5 of galliumarsenide GaAs of p-type material, having a thickness of the order of 100 μm and a high doping concentration level ($10^{18}$ at/cm$^3$). Epitaxially grown on this substrate by the well-known method of liquid phase epitaxy, there have successively been produced four layers 1, 2, 3 and 4 whose thicknesses, compositions and impurity concentrations are as follows:

Layer 1

Composition: $Ga_{1-x}Al_xAs$, with $0.3 \leq x \leq 0.4$ p-type material concentration $10^{18}$ at/cm$^3$, thickness 4 to 10 μm.

Layer 2: this being the active zone

Composition: $Ga_yAl_{1-y}As$, p- or n-type material, thickness 0.3 to 1 μm with $y<0.1$, impurity concentration $10^{16}$ to $10^{17}$.

Layer 3

Composition: $Ga_{1-x}Al_xAs$, thicknesses 1 to 5 μm, n-type material and concentration $10^{18}$ at/cm$^3$.

Layer 4

Composition $Ga_{1-z}Al_zAs$ of n-type material, where $z \simeq y+0.1$.

The substrate contains a central opening in which the optical fibre $F_1$ is placed. This opening is required since pure GaAs has low transparency vis-a-vis the light radiations of wavelengths in the range 0.8 to 0.9 μm. It carries a contact 10 on its top part. Similarly, the zone 4 enables the assembly to be contacted to a base 6. Those skilled in the art will realise that contacts with layers of the composition $Al_xAs_{1-x}Ga$ are the more difficult the larger the value of x, in particular in the order ranging from 0.3 to 1.

The optical fibre $F_2$ is arranged in an opening in the base 6.

The unusefull zones 7 of the diode are rendered insulating by proton bombardment.

Another example shown in FIG. 5 illustrates a much less fragile diode not containing any central opening.

The substrate which supports the diode is made of a material which is transparent vis-a-vis the radiations having wavelengths in the order of 1.2 μm.

This material is indium-phosphide, InP. Upon a substrate of indium-phosphide having a thickness of 100 μm, there have been successively deposited by well-known methods of liquid phase epitaxy:

a layer 1 of indium-phosphide of thickness 1 to 5 μm, having n-type conductivity (doping concentration of the order of $10^{18}$ at/cm$^3$;)

a layer 2, i.e. the active zone, forming an n-type or p-type hetero-junction and of thickness 0.3 to 1 microns, having the formula:

$In_{1-x}Ga_xAs_{1-y}P_y$ where:
$0.1 < x < 0.2$
$0.5 < y < 0.7$ a layer 3 of thickness 5 to 10 μm, made of p-type material with a doping level of the order of $10^{18}$ at/cm$^3$.

In order to localise the active area, the assembly has been subjected to an appropriate treatment (proton implantation, "mesa" operation, localised diffusion).

The FIG. 5 illustrates a mesa-type diode. The assembly rests upon a metal base 5 and contacts 10 are provided on the top of the mesa plateau.

In both cases, the emitted power is around 1 mW for an injected current of 50 mA, the attenuation introduced by the diode between the fibres 101 and 102 being less than 2 dB.

What we claim is:

1. An electroluminescent and photodiode comprising: first and second semiconductor material electrodes having respectively first and second conductivity type opposite to one another, each such electrode being transparent as a consequence of its respective energy band gap to light radiation in a predetermined wavelength range; and an active semiconductor material layer sandwiched between said first and second electrodes which as a consequence of its energy band gap, absorbs radiation in said predetermined wavelength range, said active semiconductor Material layer being sufficiently thin so that it is transparent to said radiation, said diode, when directly biassed emitting radiation in said predetermined wavelength range through said electrodes.

2. A diode as claimed in claim 1 further including a thick substrate upon which said electrodes and said active semiconductor layer are disposed, and wherein said substrate is made of a material which absorbs radiation in said predetermined wavelength range, said substrate comprising a central opening for coupling said diode to an optical fiber.

3. A diode as claimed in claim 2, wherein said substrate is made of gallium arsenide, said active layer of a material whose chemical formula is $Ga_{1-y}Al_yAs$ and with a thickness of the order of 0.2 to 1 μm, where $0 < y < 0.1$, said two electrodes being made of materials having the chemical formula:

$Ga_{1-x}Al_xAs$ where $0.3 < x < 0.4$, their respective thicknesses being of the order of 5 μm.

4. A diode as claimed in claim 3, wherein a supplementary layer is deposited on one of said electrodes, this layer having a chemical formula of the kind:

$Ga_{1-z}Al_zAs$ where $y < z < x$

5. A diode as claimed in claim 1, wherein said substrate is made of a material which produces virtually no absorption of said radiation.

6. A diode as claimed in claim 5, wherein said material is indium phosphide, said active layer being made of a material whose chemical formula is:

$In_{1-x}Ga_xAs_{1-y}P_y$ where
$0.1 < x < 0.2$
$0.5 < y < 0.7$,
the thickness being of the order of 0.2 to 1 μm, said electrodes being made of indium-phosphide having a thickness of the order of 5 μm.

7. A diode as claimed in claim 6 being of the "mesa" type.

8. A busbar line for serving subscribers through optical fibers carrying light radiation, comprising for each subscriber and inserted in said line, a diode, having two electrodes each facing one end face of said busbar line, and being made of a semiconductor material transparent to said radiation, said diode comprising an active semiconductor material layer inserted between said electrodes and, capable of absorbing said radiation and emitting it, said layer being sufficiently thin in order, in association with said two electrodes, to form an assembly which will transmit said radiation without substantial attenuation.

* * * * *